(12) United States Patent
Dosho et al.

(10) Patent No.: US 8,013,650 B2
(45) Date of Patent: Sep. 6, 2011

(54) PHASE ADJUSTMENT CIRCUIT

(75) Inventors: Shiro Dosho, Osaka (JP); Shiro Sakiyama, Kyoto (JP); Yusuke Tokunaga, Hyogo (JP); Seiji Watanabe, Kyoto (JP); Hiroshi Koshida, Osaka (JP)

(73) Assignee: Panasonic Corporation, Osaka (JP)

( * ) Notice: Subject to any disclaimer, the term of this patent is extended or adjusted under 35 U.S.C. 154(b) by 1355 days.

(21) Appl. No.: 11/514,151

(22) Filed: Sep. 1, 2006

(65) Prior Publication Data

US 2007/0121761 A1     May 31, 2007

(30) Foreign Application Priority Data

Nov. 29, 2005 (JP) ................. 2005-344218

(51) Int. Cl.
*H03H 11/16* (2006.01)
(52) U.S. Cl. ...................... 327/231; 327/237
(58) Field of Classification Search ............. None
See application file for complete search history.

(56) References Cited

U.S. PATENT DOCUMENTS

| | | | |
|---|---|---|---|
| 5,781,056 A * | 7/1998 | Fujii ............................ | 327/276 |
| 6,172,537 B1 * | 1/2001 | Kanou et al. ................... | 327/99 |
| 6,392,462 B2 * | 5/2002 | Ebuchi et al. .................. | 327/295 |
| 7,319,349 B2 * | 1/2008 | Tomita .......................... | 327/144 |
| 7,609,102 B2 * | 10/2009 | Shanbhag et al. ............. | 327/231 |
| 7,791,382 B2 * | 9/2010 | Nedachi ........................ | 327/141 |
| 2004/0107390 A1 | 6/2004 | Fujita | |

FOREIGN PATENT DOCUMENTS

| | | |
|---|---|---|
| JP | 2000-059183 | 2/2000 |
| JP | 2004-080101 | 3/2004 |
| WO | WO 2005/008894 A1 | 1/2005 |

OTHER PUBLICATIONS

European Search Report issued in European Patent Application No. EP 06119004.7, mailed Mar. 11, 2009.
Fiedler, A., et al., "FP 15.1: A 1.0625Gbps Transceiver with 2x-Oversampling and Transmit Signal Pre-Emphasis", IEEE International Solid-State Circuits Conference, Feb. 1997, pp. 238-239, 464, vol. 40.
GU, R., et al., "A 0.5-3.5Gb/s Low-Power Low-Jitter Serial Data CMOS Transceiver", IEEE International Solid State Circuits Conference, Feb. 1999, pp. 352-353, 478, vol. 42.
Yoshiaki Konno et al., "A CMOS 1X-to 16X-Speed DVD Write Channel IC", IEEE International Solid-State Circuits Conference, Feb. 9, 2005, pp. 568-569, 618.
Japanese Notice of Reasons for Rejections, with English Translation, issued in Japanese Patent Application No. 2005-344218, mailed Feb. 15, 2011.

* cited by examiner

*Primary Examiner* — Cassandra Cox
(74) *Attorney, Agent, or Firm* — McDermott Will & Emery LLP

(57) ABSTRACT

A phase adjustment circuit includes first to nth two-phase adjustment circuits. Each two-phase adjustment circuit includes a first logic circuit for performing logical sum of two input signals, a second logic circuit for performing logical product of the two input signals, a first delay circuit having a signal delay equal to that of the second logic circuit and configured to delay a signal output from the first logic circuit, and a second delay circuit having a signal delay equal to that of the first logic circuit and configured to delay a signal output from the second logic circuit. Two signals output from two of the two-phase adjustment circuits in a certain stage are input into one of the two-phase adjustment circuits in the next stage.

13 Claims, 8 Drawing Sheets

PHASE ADJUSTMENT CIRCUIT

CROSS-REFERENCE TO RELATED APPLICATION

This application claims priority under 35 USC §119 to Japanese Patent Application No. 2005-344218 filed on Nov. 29, 2005, the entire contents of all of which are incorporated herein by reference.

BACKGROUND OF THE INVENTION

1. Field of the Invention

The present invention relates to a phase adjustment circuit for adjusting the phases of a plurality of signals.

2. Description of the Related Art

To record information on a recordable optical disk medium, it is necessary to generate a special write waveform for suppressing interference of a write signal. This sometimes requires phase information that is finer than one-fortieth of the write data rate. For example, a 16x DVD system needs very short phase information with a resolution of about 50 psec.

In an optical disk drive and the like, a set of signals with fine phases generated by a signal processing LSI is usually transmitted through an output driver, such as an LVDS, to a write amplifier attached at the tip of the optical pickup (see, for example, Yoshiaki Konno et al., "A CMOS 1X- to 16X-Speed DVD Write Channel IC", IEEE International Solid-State Circuits Conference, Feb. 9, 2005, pp. 568-569, 618).

In the case where the set of fine-phase signals is transmitted over a long distance, a problem arises in that when the signals reach the write amplifier, the phase relation among the signals collapses due to variation in delay in the signal lines and the like. To be specific, the signal processing LSI produced the set of signals whose phase should increase monotonously, but the monotonic phase increase collapses when the signals reach the write amplifier. As a result, in spite of control for increasing the pulse width of a write signal, for example, the actual write signal has a narrow pulse width, which results in degradation of the quality of the writing on the optical disk medium. As writing speed is expected to increase, there is concern that this kind of problem will become more serious in the future.

SUMMARY OF THE INVENTION

In view of the above problem, it is therefore an object of the present invention to realize a phase adjustment circuit for compensating for the phases of a plurality of input signals and improving monotonic phase increase in these signals.

In order to achieve the object, a first inventive phase adjustment circuit for adjusting phases of a plurality of input signals includes: first to nth two-phase adjustment circuits, where n is a natural number, wherein the mth two-phase adjustment circuit, where m is each integer from 1 to n, includes: a first input terminal into which a 2m−1th signal is input; a second input terminal into which a 2mth signal is input; a first output terminal from which the 2m−1th signal after phase adjustment is output; a second output terminal from which the 2mth signal after phase adjustment is output; a first logic circuit for receiving the 2m−1th and 2mth signals from the first and second input terminals and generating a signal whose logic changes in a predetermined manner when either the 2m−1th or 2mth signal goes to a certain logic level; a second logic circuit for receiving the 2m−1th and 2mth signals from the first and second input terminals and generating a signal whose logic changes in the predetermined manner when the 2m−1th and 2mth signals both go to the certain logic level; a first delay circuit having a signal delay equal to that of the second logic circuit and configured to output to the first output terminal a signal obtained by delaying the signal generated by the first logic circuit; and a second delay circuit having a signal delay equal to that of the first logic circuit and configured to output to the second output terminal a signal obtained by delaying the signal generated by the second logic circuit.

Then, in the mth two-phase adjustment circuit, the first and second logic circuits each perform certain logic operation for the 2m−1th and 2mth signals input into the first and second input terminals and generate a signal whose logic changes in a certain manner. And these generated signals are respectively delayed by the first delay circuit having a signal delay equal to that of the second logic circuit and the second delay circuit having a signal delay equal to that of the first logic circuit and the delayed signals are output to the first and second output terminals. Therefore, the 2m−1th and 2mth signals, which are output from the mth two-phase adjustment circuit while the phase difference between the 2m−1th and 2mth signals input into the mth two-phase adjustment circuit is maintained irrespective of their phase lead/lag relation, are in certain phase lead/lag relation. And with the first to nth two-phase adjustment circuits, it is possible to perform phase adjustment which improves monotonic increase in the even number (2n) of input signals.

A second inventive phase adjustment circuit is the first inventive phase adjustment circuit further including an n+1th two-phase adjustment circuit, wherein the n+1th two-phase adjustment circuit includes: a first input terminal into which a 2n+1th signal is input; a second input terminal into which a 2n+2th signal is input; a first output terminal from which the 2n+1th signal after phase adjustment is output; a second output terminal from which the 2n+2th signal after phase adjustment is output; a first logic circuit for receiving the 2n+1th and 2n+2th signals from the first and second input terminals and generating a signal whose logic changes in a predetermined manner when either the 2n+1th or 2n+2th signal goes to a certain logic level; a second logic circuit for receiving the 2n+1th and 2n+2th signals from the first and second input terminals and generating a signal whose logic changes in the predetermined manner when the 2n+1th and 2n+2th signals both go to the certain logic level; a first delay circuit having a signal delay equal to that of the second logic circuit and configured to output to the first output terminal a signal obtained by delaying the signal generated by the first logic circuit; and a second delay circuit having a signal delay equal to that of the first logic circuit and configured to output to the second output terminal a signal obtained by delaying the signal generated by the second logic circuit; and at least either the first or 2n+2th signal is at a certain logic level.

Then, it is possible to perform phase adjustment which improves monotonic increase in the odd number (2n+1) of input signals.

Another inventive phase adjustment circuit for adjusting phases of a plurality of input signals includes: a first phase adjustment circuit, which is the above-mentioned first inventive phase adjustment circuit; and a second phase adjustment circuit, which is the above-mentioned second inventive phase adjustment, wherein the first output terminal of the mth two-phase adjustment circuit in the first phase adjustment circuit is connected with the second input terminal of the mth two-phase adjustment circuit in the second phase adjustment circuit; the second output terminal of the mth two-phase adjustment circuit in the first phase adjustment circuit is connected with the first input terminal of the m+1th two-phase adjustment circuit in the second phase adjustment circuit; a signal at a first logic level is input into the first input terminal of the first two-phase adjustment circuit in the second phase adjustment circuit; and a signal at a second logic level is input into the second input terminal of the n+1th two-phase adjustment circuit in the second phase adjustment circuit.

In this inventive phase adjustment circuit, the first phase adjustment circuit performs phase adjustment for an even number (2n) of input signals and then the second phase adjustment circuit performs phase adjustment for signals output from two different two-phase adjustment circuits in the first phase adjustment circuit. This allows monotonic increase to be further improved in the 2n signals output from the second phase adjustment circuit.

Another inventive phase adjustment circuit for adjusting phases of a plurality of input signals includes first and second phase adjustment circuits, each of which is the above-mentioned second inventive phase adjustment circuit, wherein a signal at a first logic level is input into the second input terminal of the n+1th two-phase adjustment circuit in the first phase adjustment circuit; a signal at a second logic level is input into the first input terminal of the first two-phase adjustment circuit in the second phase adjustment circuit; the first output terminal of the kth two-phase adjustment circuit (where k is each integer from 1 to n+1) in the first phase adjustment circuit is connected with the second input terminal of the kth two-phase adjustment circuit in the second phase adjustment circuit; and the second output terminal of the mth two-phase adjustment circuit in the first phase adjustment circuit is connected with the first input terminal of the m+1th two-phase adjustment circuit in the second phase adjustment circuit.

In this inventive phase adjustment circuit, the first phase adjustment circuit performs phase adjustment for an odd number (2n+1) of input signals and then the second phase adjustment circuit performs phase adjustment for signals output from two different two-phase adjustment circuits in the first phase adjustment circuit. This allows monotonic increase to be further improved in the 2n+1 signals output from the second phase adjustment circuit.

Another inventive phase adjustment circuit for adjusting phases of a plurality of input signals includes first to nth logic circuits, where n is a natural number, wherein the mth logic circuit (where m is each integer from 1 to n−1) receives m−1th and mth signals and outputs, as a new mth signal, a signal whose logic changes in a predetermined manner when the m−1th and mth signals both go to a certain logic level; and the nth logic circuit receives an nth signal and a signal at the certain logic level and outputs, as a new nth signal, a signal whose logic changes in the predetermined manner when the received nth signal goes to the certain logic level.

In this inventive phase adjustment circuit, of the m−1th and mth signals input into the mth logic circuit, the one whose phase is lagging is output as the new mth signal. It is therefore possible to perform phase adjustment that improves monotonic increase in the n input signals.

Still another inventive phase adjustment circuit for adjusting phases of two input signals includes: a first logic circuit for performing logical sum of the two signals; a second logic circuit for performing logical product of the two signals; a first delay circuit having a signal delay equal to that of the second logic circuit and configured to delay a signal output from the first logic circuit; and a second delay circuit having a signal delay equal to that of the first logic circuit and configured to delay a signal output from the second logic circuit.

In this inventive phase adjustment circuit, the first and second logic circuits each perform certain logic operation for the two input signals and generate a signal whose logic changes in a certain manner. And these generated signals are respectively delayed by the first delay circuit having a signal delay equal to that of the second logic circuit and the second delay circuit having a signal delay equal to that of the first logic circuit and the first and second delay circuits output the delayed signals. Therefore, the two signals, which are output from the first and second delay circuits with the phase difference between the two input signals being maintained irrespective of their phase lead/lag relation, are in certain phase lead/lag relation.

As described above, according to the present invention, the phases of input signals are compensated for, and monotonic phase increase is improved in these signals.

DETAILED DESCRIPTION OF THE INVENTION

Hereinafter, the preferred embodiments of the present invention will be described with reference to the accompanying drawings.

First Embodiment

Figure 1:
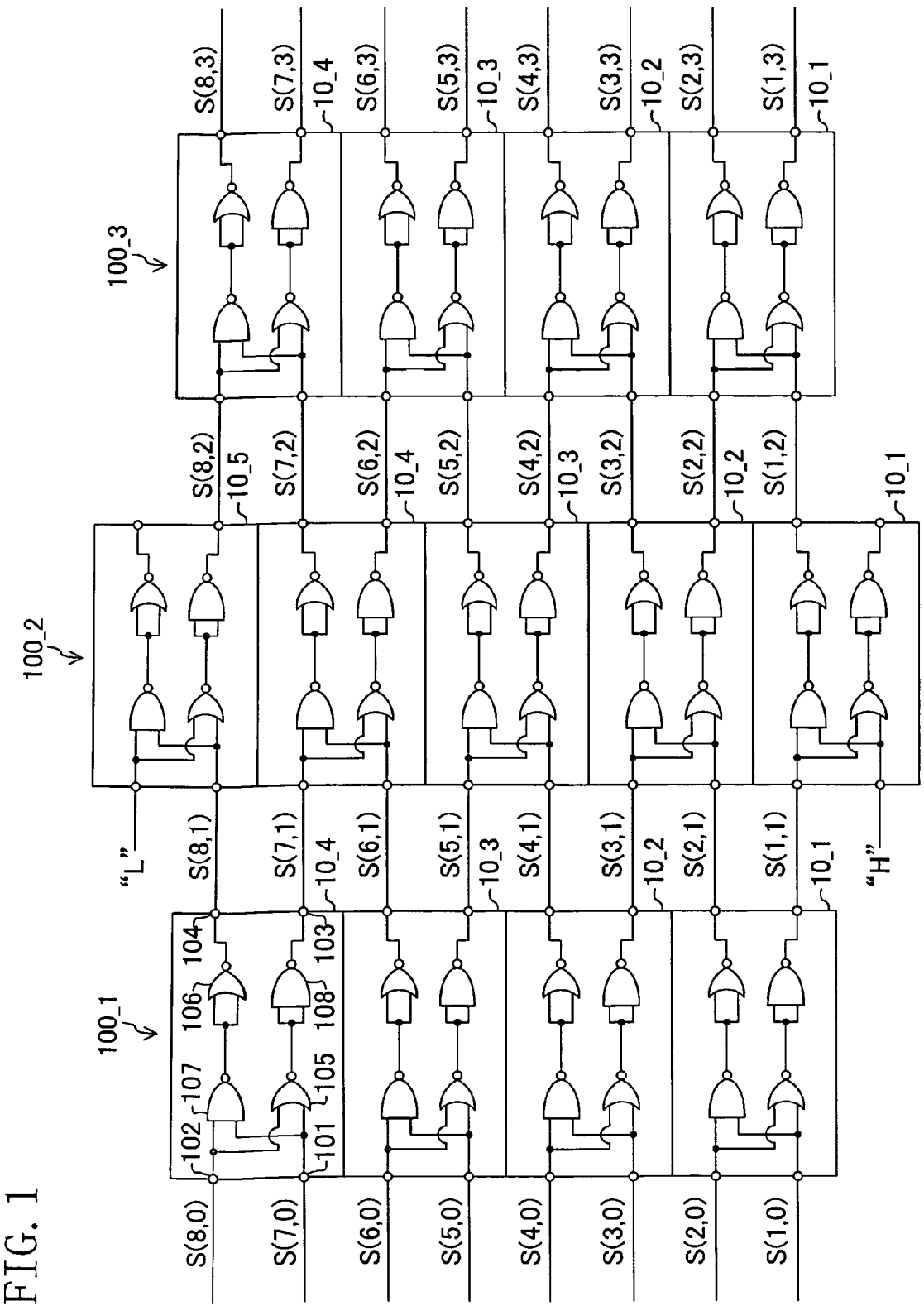
FIG. 1 illustrates the structure of a phase adjustment circuit according to a first embodiment.

FIG. 1 illustrates the structure of a phase adjustment circuit according to a first embodiment. In the phase adjustment circuit, three 8-input 8-output phase adjustment circuits 100_1, 100_2, and 100_3 are connected in series. Each phase adjustment circuit 100_j receives signals S(i, j−1) and outputs signals S(i, j) obtained after phase adjustment, where i is each integer from 1 to 8 and j is each integer from 1 to 3. The phase adjustment circuits 100_1 and 100_3 each include four two-phase adjustment circuits 10_1, 10_2, 10_3, and 10_4. The phase adjustment circuit 100_2 includes five two-phase adjustment circuits 10_1, 10_2, 10_3, 10_4, and 10_5. In the following descriptions, when a representative one of the members of the same kind is mentioned, a reference numeral with no adscript will be used to denote the representative one.

Each two-phase adjustment circuit 10 includes: an input terminal 101 into which a first signal is input; an input terminal 102 into which a second signal is input; an output terminal 103 from which the first signal after phase adjustment is output; an output terminal 104 from which the second signal after phase adjustment is output; NOR gates 105 and 106; and NAND gates 107 and 108. The two inputs of each of the NOR gate 105 and the NAND gate 107 are connected with the input terminals 101 and 102. The two inputs of the NAND gate 108 are short-circuited to receive the output of the NOR gate 105, and the NAND gate 108 outputs arithmetic result to the output terminal 103. Likewise, the two inputs of the NOR gate 106 are short short-circuited to receive the output of the NAND gate 107, and the NOR gate 106 outputs arithmetic result to the output terminal 104.

Figure 2:
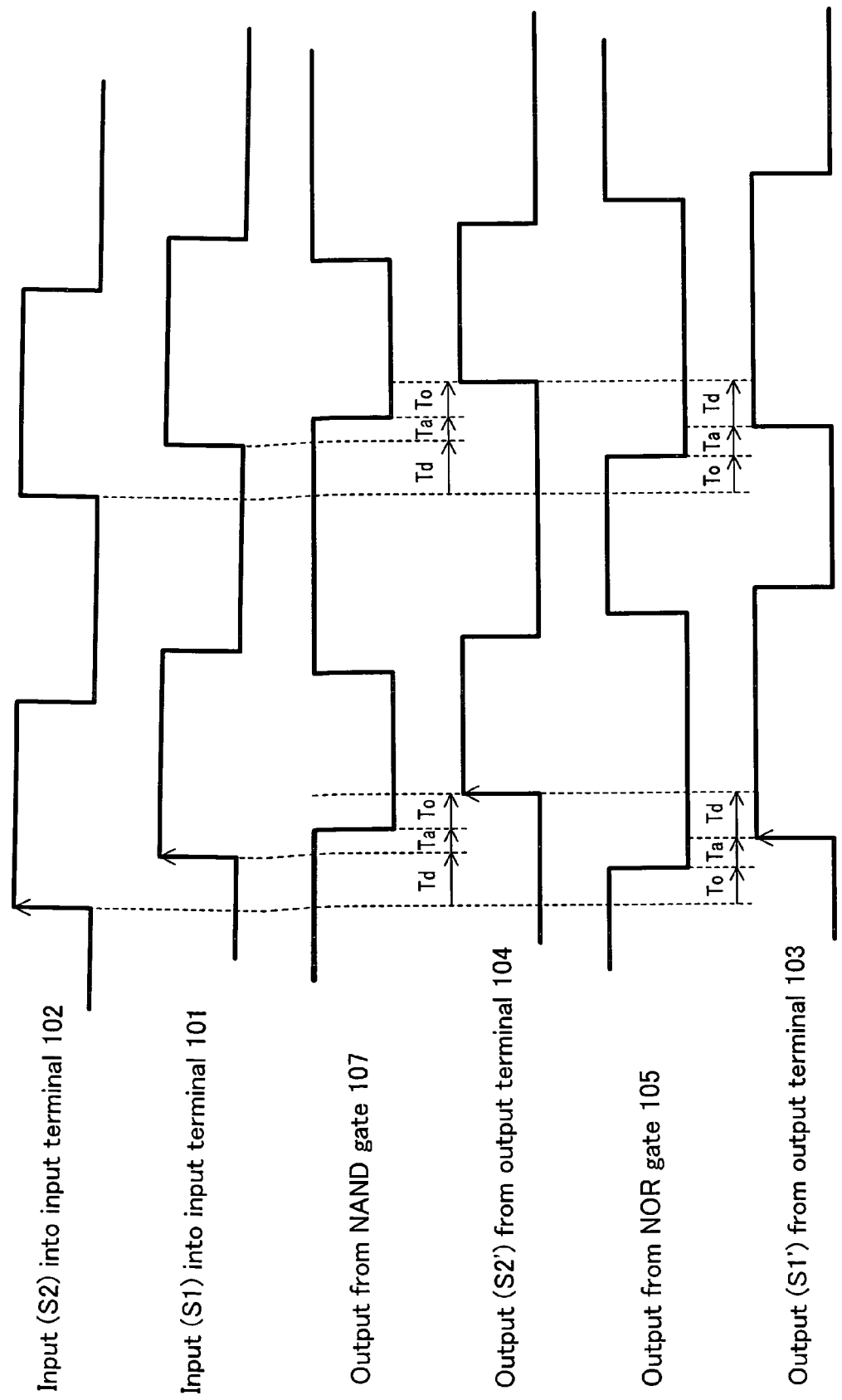
FIG. 2 is a timing chart for a two-phase adjustment circuit shown in FIG. 1.

FIG. 2 is a timing chart for the two-phase adjustment circuit 10. It is assumed that the timing of the rising edge of a signal S1, which is input into the input terminal 101, is delayed behind the timing of the rising edge of a signal S2, which is input into the input terminal 102, by time Td. That is, it is assumed that the phase of the signal S1 lags behind the phase of the signal S2. In this case, the output signal of the NAND gate 107 is delayed behind the phase lag signal S1 by time Ta. The time Ta is gate delay of the NAND gate 107. On the other hand, the output signal of the NOR gate 105 is delayed behind the phase lead signal S2 by time To. The time To is gate delay of the NOR gate 105. In other words, with respect to the phase lead signal S2, the output signal of the NAND gate 107 is delayed by the time Td+Ta, while the output signal of the NOR gate 105 is delayed by the time To. The phase difference between these signals is therefore the time Td+Ta−To. In this case, since the gate delay (i.e., the time Ta) of the NAND gate 107 and the gate delay (i.e., the time To) of the NOR gate 105 slightly differ from each other, the time Ta−To is not always zero. Therefore, the phase difference between the output signal of the NAND gate 107 and the output signal of the NOR gate differs from the time Td, which is the phase difference between the original signals S1 and S2.

The NOR gate 106 and the NAND gate 108 therefore compensate for this difference. Specifically, the NOR gate 106 further delays the signal output from the NAND gate 107. Gate delay of the NOR gate 106 is equal to that of the NOR gate 105 and hence to the time To. As a result, the output signal of the NOR gate 106, i.e., a signal S2' output from the output terminal 104, lags behind the phase lead signal S2 by the time Td+Ta+To. Likewise, the NAND gate 108 further delays the output signal of the NOR gate 105. Gate delay of the NAND gate 108 is equal to that of the NAND gate 107 and hence to the time Ta. As a result, the output signal of the NAND gate 108, i.e., a signal S1' output from the output terminal 103, lags behind the signal S2 by the time To+Ta. That is, with respect to the phase lead signal S2, the signal S1' is delayed by the time Td+Ta+To, while the signal S2' is delayed by the time To+Ta. The phase difference between these signals is therefore the time Td, which means that the phase difference between the original signals S1 and S2, that is, the time Td, is maintained.

As described above, in the two-phase adjustment circuit 10 according to this embodiment, the phase lead signal is output from the output terminal 103 and the phase lag signal is output from the output terminal 104, while the phase difference between the two signals input into the input terminals 101 and 102 is maintained irrespective of the phase lead and lag of those two signals. In other words, the two-phase adjustment circuit 10 according to this embodiment has the function of interchanging the phases of the two signals.

Referring back to FIG. 1, the phase adjustment circuits 100_2 and 100_1 are connected so that their inputs and outputs are connected in displaced relationship. The phase adjustment circuits 100_3 and 100_2 are also connected so that their inputs and outputs are connected in displaced relationship.

Specifically, the output terminals 103 and 104 of each two-phase adjustment circuit 10_m (where m is each integer from 1 to 4) in the phase adjustment circuit 100_1 are respectively connected with the input terminal 102 of the two-phase adjustment circuit 10_m and the input terminal 101 of the two-phase adjustment circuit 10_m+1 in the phase adjustment circuit 100_2. And the output terminal 104 of the two-phase adjustment circuit 10_m and the output terminal 103 of the two-phase adjustment circuit 10_m+1 in the phase adjustment circuit 100_2 are respectively connected with the input terminals 101 and 102 of the two-phase adjustment circuit 10_m in the phase adjustment circuit 100_3. Signals at the logic levels "H" and "L" are respectively input into the input terminal 101 of the two-phase adjustment circuit 10_1 and the input terminal 102 of the two-phase adjustment circuit 10_5 in the phase adjustment circuit 100_2.

Each signal S(i, 0) that is input into the phase adjustment circuit of this embodiment is first input into the phase adjustment circuit 100_1. For four pairs of signals, i.e., signals S(1, 0) and S(2, 0), signals S(3, 0) and S(4, 0), signals S(5, 0) and S(6, 0), and signals S(7, 0) and S(8, 0), the phase adjustment circuit 100_1 outputs four pairs of signals, i.e., signals S(1, 1) and S(2, 1), signals S(3, 1) and S(4, 1), signals S(5, 1) and S(6, 1), and signals S(7, 1) and S(8, 1), aligned in order of leading phase, with the phase difference between each original signal pair being maintained.

Next, for three pairs of signals, i.e., the signals S(2, 1) and S(3, 1), the signals S(4, 1) and S(5, 1), and the signals S(6, 1) and S(7, 1), the phase adjustment circuit 100_2 outputs three pairs of signals, i.e., signals S(2, 2) and S(3, 2), signals S(4, 2) and S(5, 2), and signals S(6, 2) and S(7, 2), aligned in order of leading phase, with the phase difference between each original signal pair being maintained. The signal S(1, 1) and the signal at the logic level "H" are input into the two-phase adjustment circuit 10_1, but the phase of the latter is always leading the phase of the former, such that the signal S(1, 2) is output as a signal obtained by delaying the signal S(1, 1) by the same length of time as that for the other signals (i, 1). Similarly, the signal S(8, 1) and the signal at the logic level "L" are input into the two-phase adjustment circuit 10_5, but the phase of the latter is always lagging behind the phase of the former, such that the signal S(8, 2) is output as a signal obtained by delaying the signal S(8, 1) by the same length of time as that for the other signals (i, 1).

Next, for four pairs of signals, i.e., the signals S(1, 2) and S(2, 2), the signals S(3, 2) and S(4, 2), the signals S(5, 2) and S(6, 2), and the signals S(7, 2) and S(8, 2), the phase adjustment circuit 100_3 outputs four pairs of signals, i.e., signals S(1, 3) and S(2, 3), signals S(3, 3) and S(4, 3), signals S(5, 3) and S(6, 3), and signals S(7, 3) and S(8, 3), aligned in order of leading phase, with the phase difference between each original signal pair being maintained.

As described above, in each single phase adjustment circuit 100, the phases of the input signals S(2m−1, 0) and S(2m, 0) are just interchanged. However, by connecting phase adjustment circuits 100 in two stages, the phases of the signals (i, 0) are interchanged with the phases of their previous and next signals. Logically, when the number of input signals is N, it is possible to obtain N signals aligned in order of phase by connecting phase adjustment circuits 100 in 2N stages. In other words, the 2N-stage connection of the phase adjustment circuits 100 makes it possible to compensate for a monotonic increase of N×LSB (LSB is the minimum phase between input signals).

Figure 3:
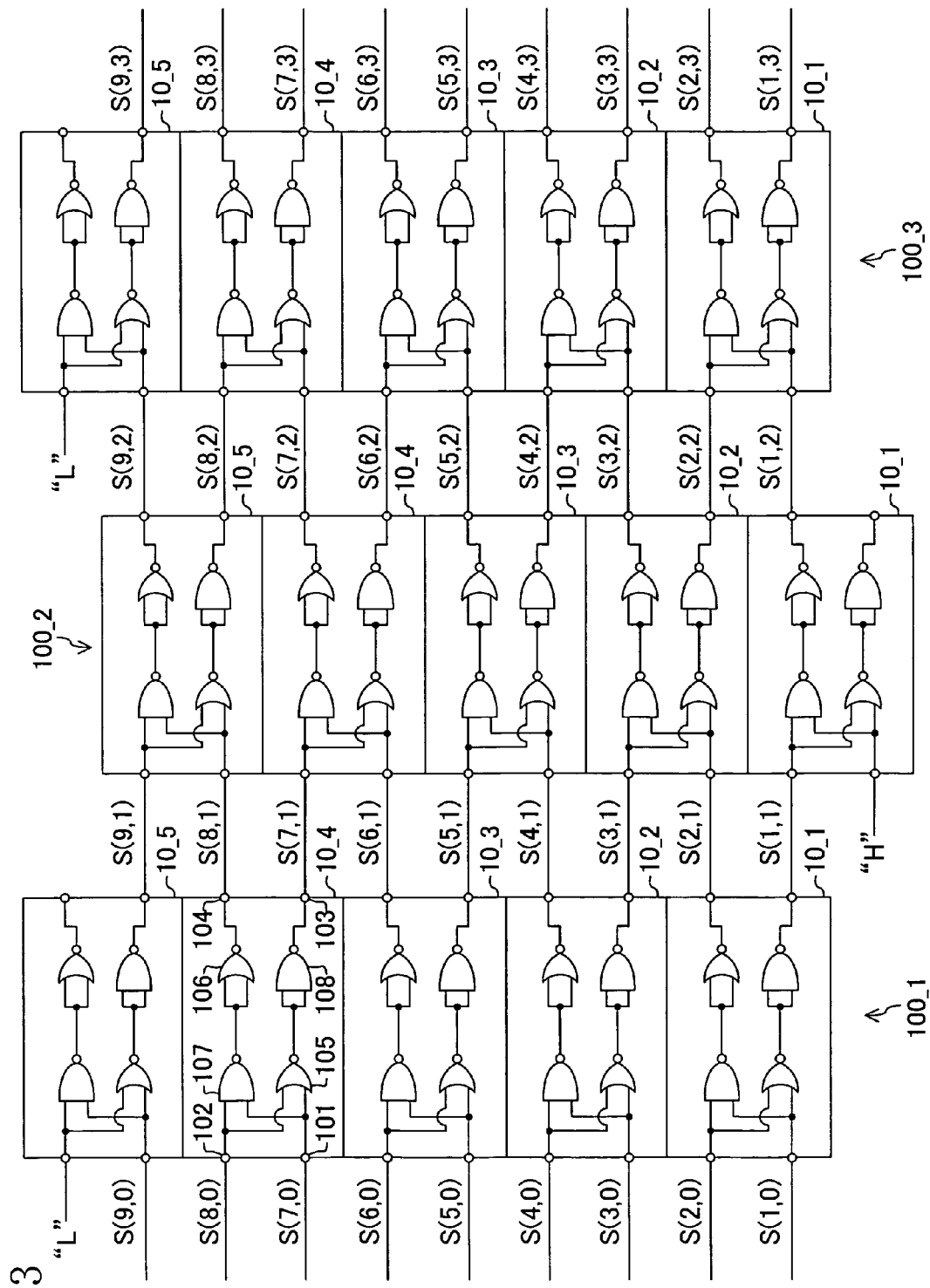
FIG. 3 illustrates the structure of an odd-number-input compatible phase adjustment circuit.

The number of signals input into the phase adjustment circuit shown in FIG. 1 is an even number, but when the number of input signals is an odd number, the phase adjustment circuit of FIG. 1 may be modified as follows. FIG. 3 illustrates the structure of an odd-number-input compatible phase adjustment circuit obtained by modifying the phase adjustment circuit of FIG. 1. In this phase adjustment circuit, the phase adjustment circuits 100_1 and 100_3 are each provided with a two-phase adjustment circuit 10_5. A signal (9, 0) and a signal at the logic level "L" are respectively input into the input terminals 101 and 102 of the two-phase adjustment circuit 10_5 in the phase adjustment circuit 100_1. Similarly, a signal (9, 2) and a signal at the logic level "L" are respectively input into the input terminals 101 and 102 of the two-phase adjustment circuit 10_5 in the phase adjustment circuit 100_3. And the input terminal 102 and output terminal 104 of the two-phase adjustment circuit 10_5 in the phase adjustment circuit 100_2 are respectively connected with the output terminal 103 of the two-phase adjustment circuit 10_5 in the phase adjustment circuit 100_1 and the input terminal 101 of the two-phase adjustment circuit 10_5 in the phase adjustment circuit 100_3. In the phase adjustment circuit thus configured, the phases of the nine input signals can be adjusted.

In the phase adjustment circuits shown in FIGS. 1 and 3, a delay circuit having a signal delay equal to that of the NAND gate 107 may be provided in place of the NAND gate 108. Likewise, a delay circuit having a signal delay equal to that of the NOR gate 105 may be provided in place of the NOR gate 106.

Second Embodiment

Figure 4:
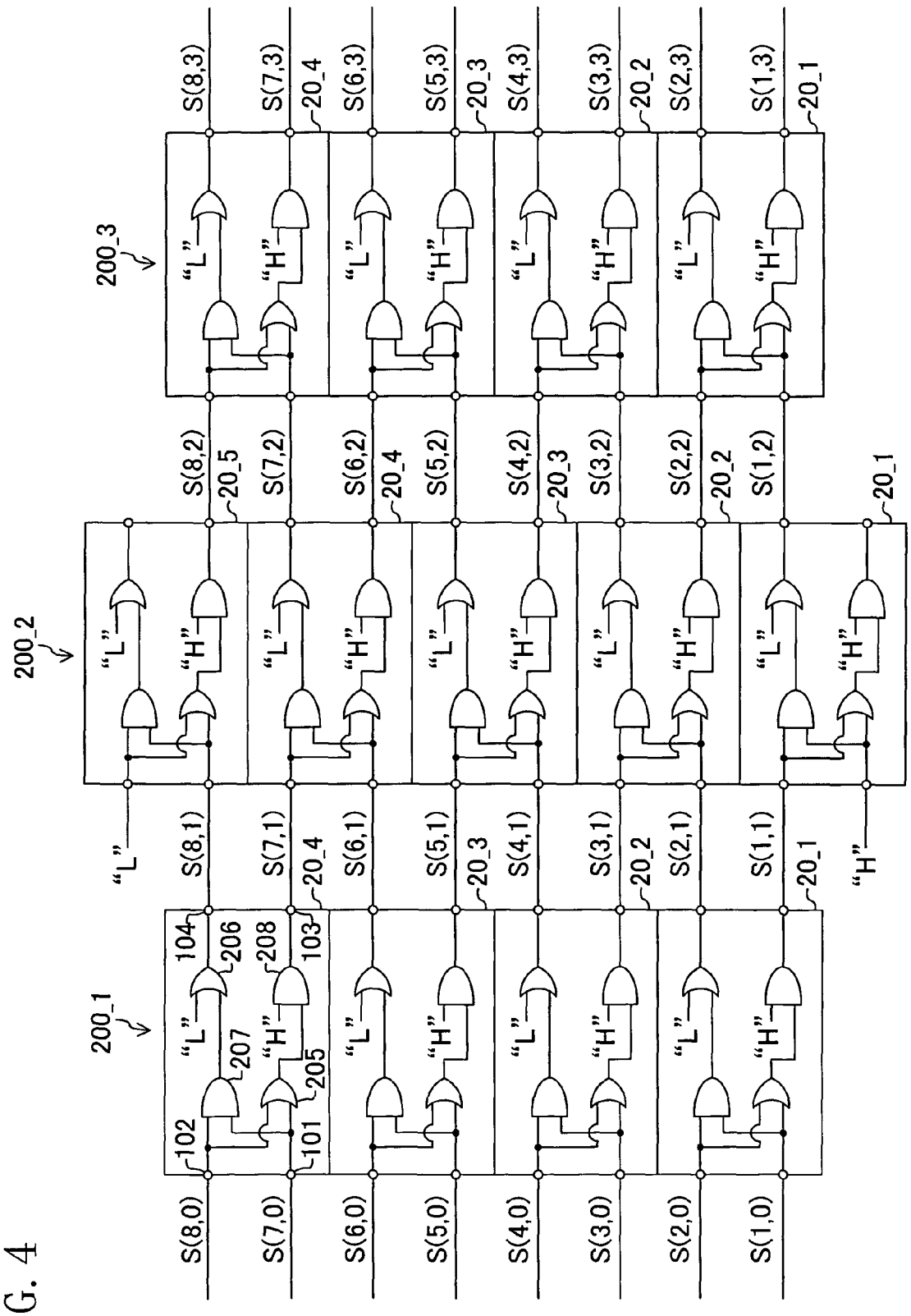
FIG. 4 illustrates the structure of a phase adjustment circuit according to a second embodiment.

FIG. 4 illustrates the structure of a phase adjustment circuit according to a second embodiment. In this phase adjustment circuit, three 8-input 8-output phase adjustment circuits 200_1, 200_2, and 200_3 are connected in series. Each phase adjustment circuit 200 includes two-phase adjustment circuits 20 which are different in structure from the two-phase adjustment circuits 10 shown in FIG. 1. The structure of the two-phase adjustment circuits 20 will be only described below.

Each two-phase adjustment circuit 20 includes an input terminal 101 into which a first signal is input; an input terminal 102 into which a second signal is input; an output terminal 103 from which the first signal after phase adjustment is output; an output terminal 104 from which the second signal after phase adjustment is output; OR gates 205 and 206; and AND gates 207 and 208. The two inputs of each of the OR gate 205 and the AND gate 207 are connected with the input terminals 101 and 102. The AND gate 208 receives the output of the OR gate 205 and a signal at the logic level "H" and outputs arithmetic result to the output terminal 103. Likewise, the OR gate 206 receives the output of the AND gate 207 and a signal at the logic level "L" and outputs arithmetic result to the output terminal 104.

A timing chart for the two-phase adjustment circuit 20 is the same as that shown in FIG. 2. The phase adjustment circuit 200 according to this embodiment therefore exhibits the same operation characteristics as the phase adjustment circuit 100 shown in FIG. 1.

As described above, the phase adjustment circuit of this embodiment may also be modified so as to be odd-number input compatible. Also, a delay circuit having a signal delay equal to that of the AND gate 207 may be provided in place of the AND gate 208. Likewise, a delay circuit having a signal delay equal to that of the OR gate 205 may be provided in place of the OR gate 206.

In the first and second embodiments, if the phase lead and lag are defined in terms of the falling edge of each signal, the resultant relation is opposite to the above-described one, that is, the phase lag signal is output from each output terminal 103 of the two-phase adjustment circuits 10 and 20, while the phase lead signal is output from each output terminal 104 thereof.

Third Embodiment

Figure 5:
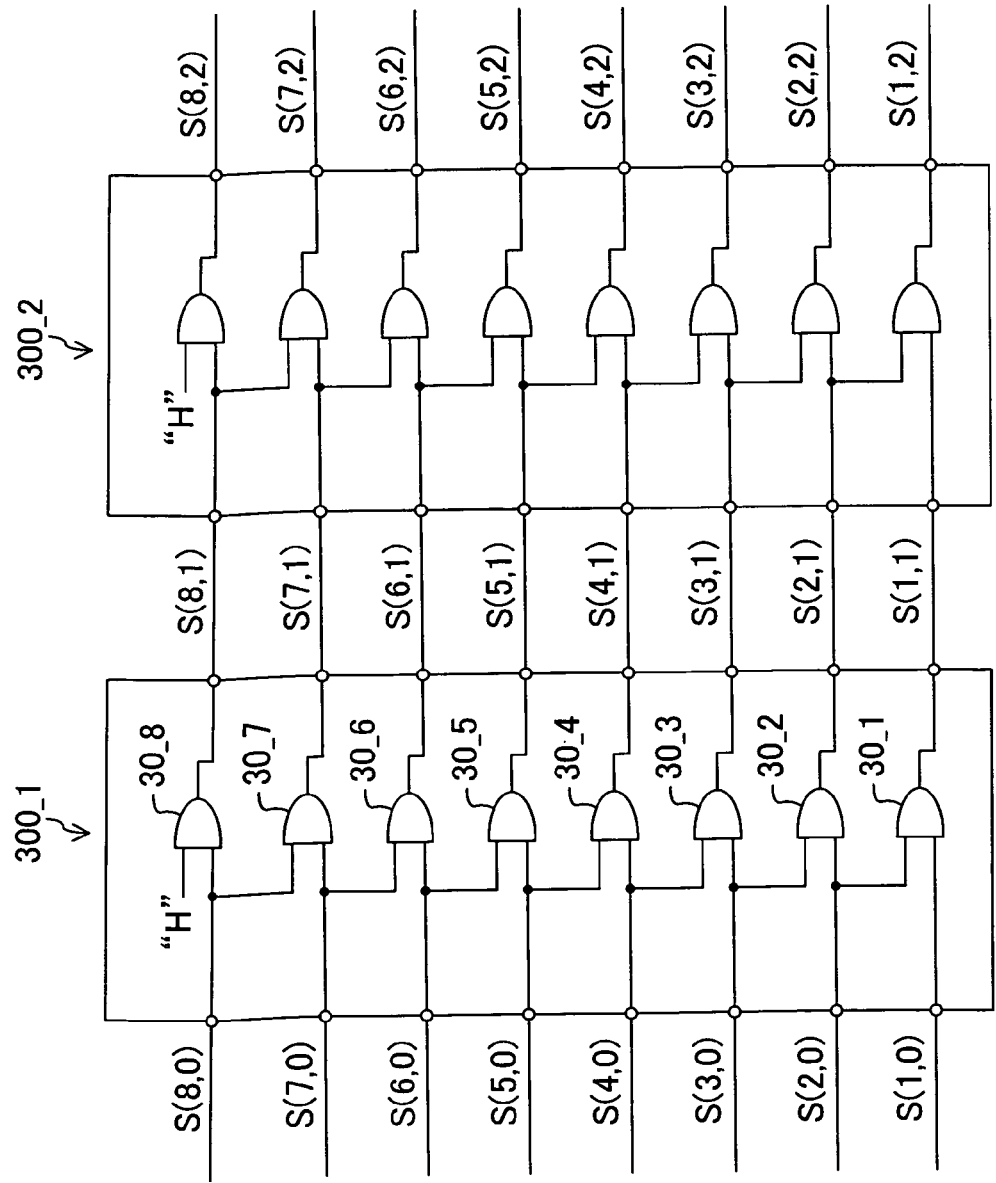
FIG. 5 illustrates the structure of a phase adjustment circuit according to a third embodiment.

FIG. 5 illustrates the structure of a phase adjustment circuit according to a third embodiment. In this phase adjustment circuit, two 8-input 8-output phase adjustment circuits 300_1 and 300_2 are connected in series. Each phase adjustment circuit 300_j receives signals S(i, j−1) and outputs signals S(i, j) obtained after phase adjustment.

The phase adjustment circuits 300_1 and 300_2 each include eight AND gates 30_1, 30_2, 30_3, 30_4, 30_5, 30_6, 30_7, and 30_8. Each AND gate 30_m (where m is each integer from 1 to 7) in the phase adjustment circuit 300_1 receives signals S(m, 0) and S(m+1, 0) and outputs a signal S(m, 1). And the AND gate 30_8 receives a signal S(8, 0) and a signal at the logic level "H" and outputs a signal S(8, 1). Likewise, each AND gate 30_m in the phase adjustment circuit 300_2 receives the signals S(m, 1) and S(m+1, 1) and outputs a signal S(m, 2). And the AND gate 30_8 receives the signal S(8, 1) and a signal at the logic level "H" and outputs a signal S(8, 2).

Figure 6:
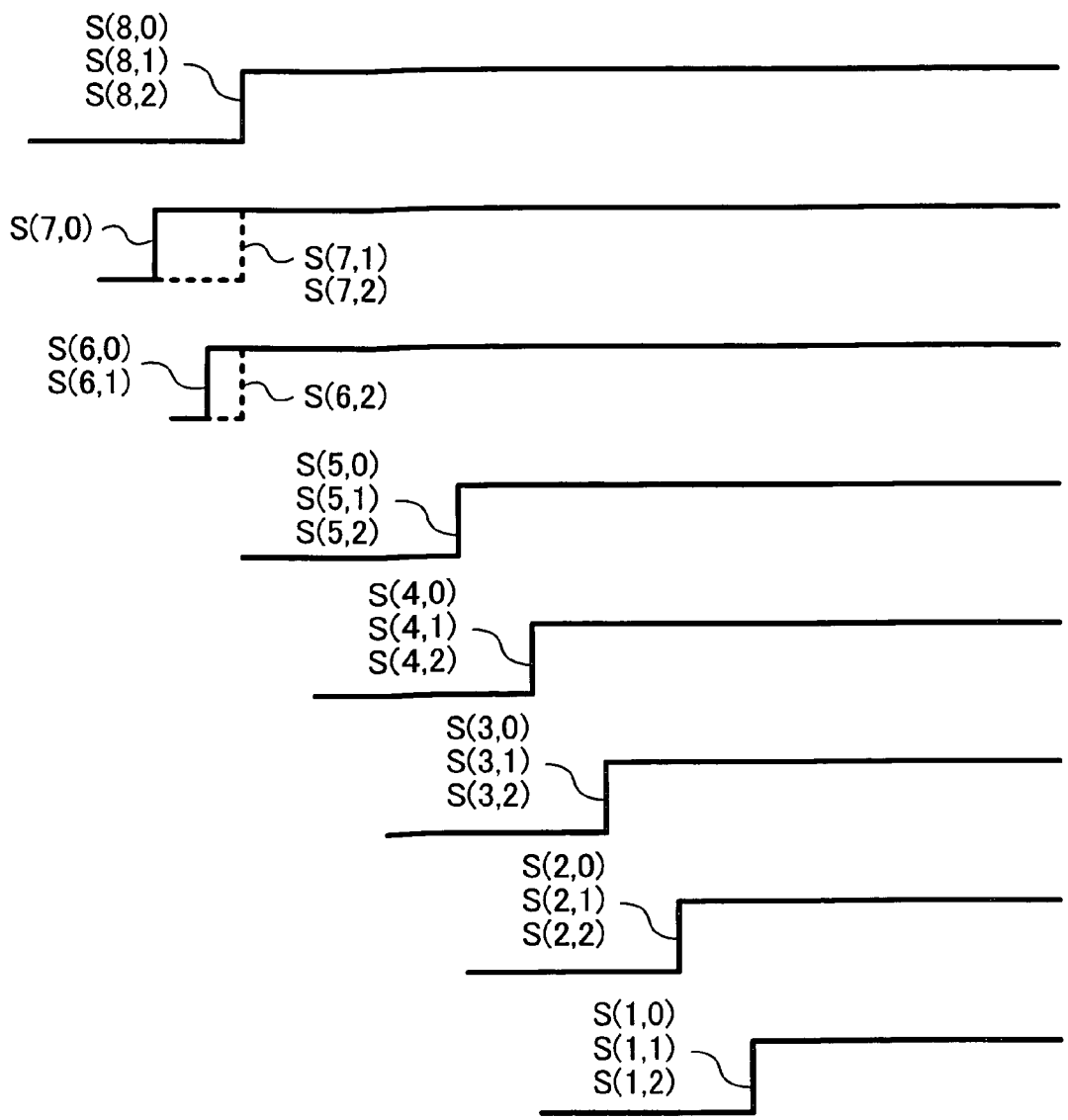
FIG. 6 is a timing chart for the phase adjustment circuit shown in FIG. 5.

FIG. 6 is a timing chart for the phase adjustment circuit of this embodiment. It is assumed that the rising edges of signals S(7, 0), S(6, 0), S(8, 0), S(5, 0), S(4, 0), S(3, 0), S(2, 0), and S(1, 0) occur in this order. The phase adjustment circuit 300_1 adjusts the phases of these signals, so that the rising edges of the signals S(8, 1) and S(7, 1) occur at the same time. This is achieved by logic operation of the signals S(8, 0) and S(7, 0) performed by the AND gate 30_7 and the resultant output of the signal S(7, 1) whose rising edge occurs when the logic levels of the signals S(8, 0) and S(7, 0) both become "H".

Next, the phase adjustment circuit 300_2 adjusts the phases of the signals S(1, 1) to S(8, 1), so that the rising edges of signals S(8, 2), S(7, 2), and S(6, 2) occur at the same time. This is achieved by logic operation of the signals S(7, 1) and S(6, 1) performed by the AND gate 30_6 and the resultant output of the signal S(6, 2) whose rising edge occurs when the logic levels of the signals S(7, 1) and S(6, 1) both become "H".

As described above, in each single phase adjustment circuit 300, phase compensation for 1LSB can only be implemented. However, more phase compensation becomes possible by connecting phase adjustment circuits 300 in multiple stages. Logically, by connecting phase adjustment circuits 300 in N stages, it becomes possible to compensate for monotonic increase up to N×LSB.

In cases where AND gates in multiple stages are connected, it is possible to simplify the logic structure further. For example, it is well known that the logic gate size can be smaller by connecting NAND gates in two stages than by connecting AND gates in two stages.

Fourth Embodiment

Figure 7:
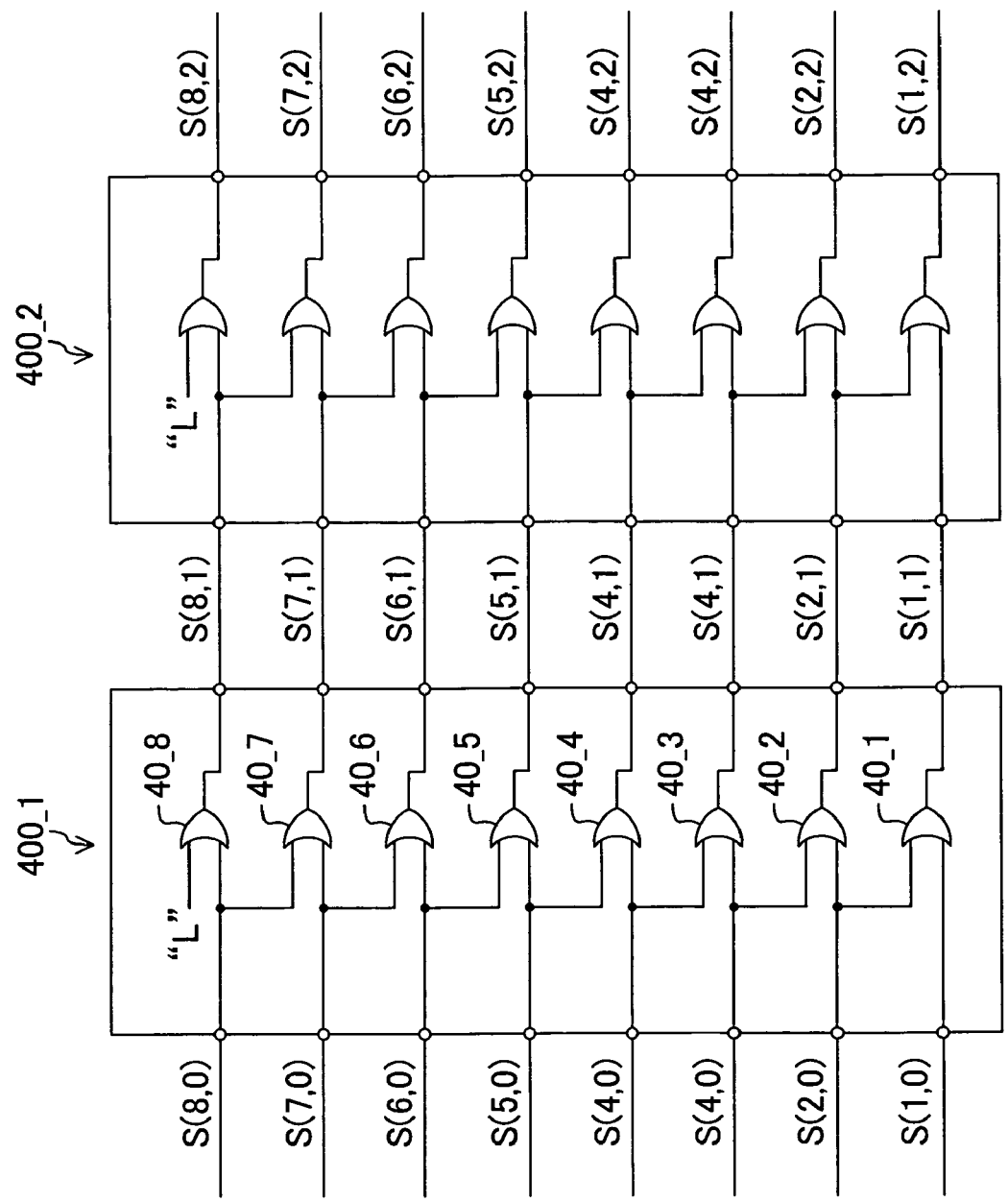
FIG. 7 illustrates the structure of a phase adjustment circuit according to a fourth embodiment.

FIG. 7 illustrates the structure of a phase adjustment circuit according to a fourth embodiment. In this phase adjustment circuit, two phase adjustment circuits 400_1 and 400_2 which are different in structure from each phase adjustment circuit 300 shown in FIG. 5 are connected in series. The structure of the phase adjustment circuit 400 will be only described below.

The phase adjustment circuits 400_1 and 400_2 each include eight OR gates 40_1, 40_2, 40_3, 40_4, 40_5, 40_6, 40_7, and 40_8. Each OR gate 40_m in the phase adjustment circuit 400_1 receives signals S(m, 0) and S(m+1, 0) and outputs a signal S(m, 1). The OR gate 40_8 receives a signal S(8, 0) and a signal at the logic level "L" and outputs a signal S(8, 1). Similarly, each OR gate 40_m in the phase adjustment circuit 400_2 receives signals S(m, 1) and S(m+1, 1) and outputs a signal S(m, 2). And the OR gate 40_8 receives the signal S(8, 1) and a signal at the logic level "L" and outputs a signal S(8, 2).

Since the output of each OR gate 40 goes to the "L" level when the two inputs thereof both go to the "L" level, the phase adjustment circuit of this embodiment is capable of performing phase adjustment based on the timing of the falling edge of each input signal.

Figure 8:
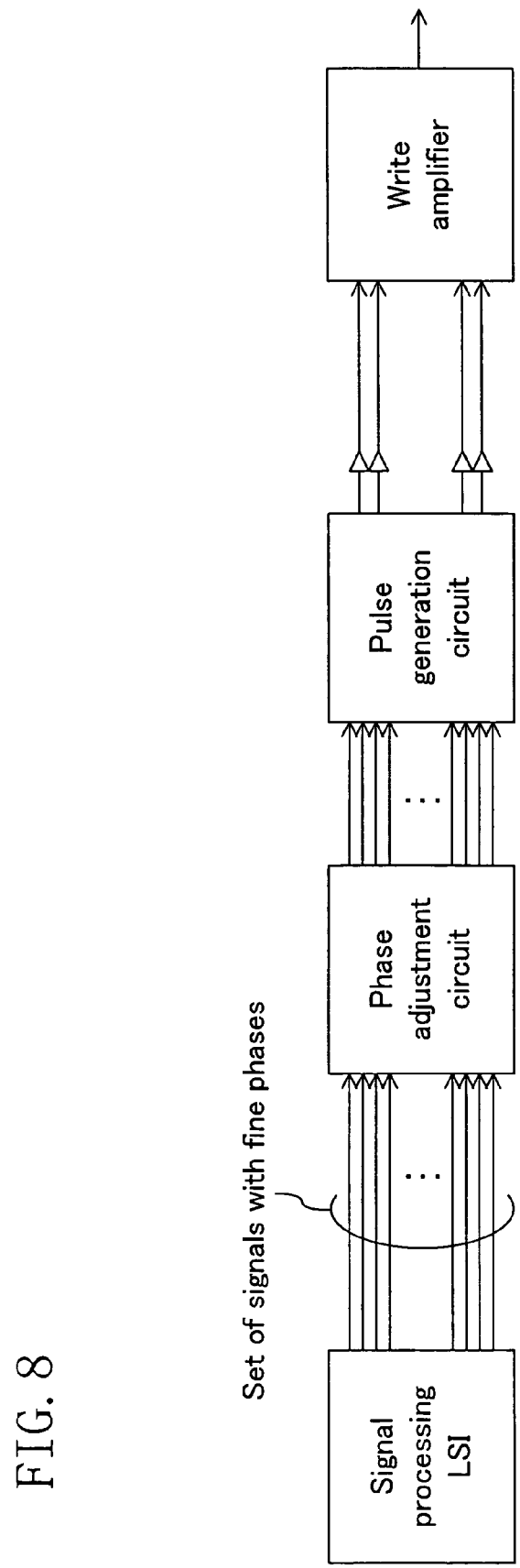
FIG. 8 illustrates the structure of an optical disk drive into which a phase adjustment circuit according to the present invention is incorporated.

The phase adjustment circuits according to the present invention are capable of compensating for monotonic phase increase in input signals and are thus effectively used to compensate for monotonic increase in phase information for generating a pulse when data is written on an optical disk medium in an optical disk drive, as shown in FIG. 8.

What is claimed is:

1. A phase adjustment circuit for adjusting phases of a plurality of input signals, the circuit comprising:
    first to nth two-phase adjustment circuits, where n is a natural number,
    wherein an mth two-phase adjustment circuit, where m indicates an integer from 1 to n, includes:
    a first input terminal into which a 2m−1th signal is input;
    a second input terminal into which a 2mth signal is input;
    a first output terminal from which the 2m−1th signal after phase adjustment is output;
    a second output terminal from which the 2mth signal after phase adjustment is output;
    a first logic circuit for receiving the 2m−1th and 2mth signals from the first and second input terminals and generating a signal whose logic changes in a predetermined manner when either the 2m−1th or 2mth signal goes to a certain logic level;
    a second logic circuit for receiving the 2m−1th and 2mth signals from the first and second input terminals and generating a signal whose logic changes in the predetermined manner when the 2m−1th and 2mth signals both go to the certain logic level;
    a first delay circuit having a signal delay equal to that of the second logic circuit and configured to output to the first output terminal a signal obtained by delaying the signal generated by the first logic circuit; and
    a second delay circuit having a signal delay equal to that of the first logic circuit and configured to output to the second output terminal a signal obtained by delaying the signal generated by the second logic circuit.

2. The circuit of claim 1, wherein the first logic circuit is a NOR gate;
    the second logic circuit is a NAND gate;
    the first delay circuit is a NAND gate with two inputs thereof short-circuited; and
    the second delay circuit is a NOR gate with two inputs thereof short-circuited.

3. The circuit of claim 1, wherein the first logic circuit is an OR gate;
    the second logic circuit is an AND gate;
    the first delay circuit is an AND gate; and
    the second delay circuit is an OR gate.

4. The circuit of claim 1, comprising an n+1th two-phase adjustment circuit, wherein the n+1th two-phase adjustment circuit includes:
    a first input terminal into which a 2n+1th signal is input;
    a second input terminal into which a 2n+2th signal is input;
    a first output terminal from which the 2n+1th signal after phase adjustment is output;
    a second output terminal from which the 2n+2th signal after phase adjustment is output;
    a first logic circuit for receiving the 2n+1th and 2n+2th signals from the first and second input terminals and generating a signal whose logic changes in a predetermined manner when either the 2n+1th or 2n+2th signal goes to a certain logic level;
    a second logic circuit for receiving the 2n+1th and 2n+2th signals from the first and second input terminals and generating a signal whose logic changes in the predetermined manner when the 2n+1th and 2n+2th signals both go to the certain logic level;
    a first delay circuit having a signal delay equal to that of the second logic circuit and configured to output to the first output terminal a signal obtained by delaying the signal generated by the first logic circuit; and
    a second delay circuit having a signal delay equal to that of the first logic circuit and configured to output to the second output terminal a signal obtained by delaying the signal generated by the second logic circuit; and
    at least either the first or 2n+2th signal is at a certain logic level.

5. A phase adjustment circuit for adjusting phases of a plurality of input signals, the circuit comprising:
    1. phase adjustment circuit, which is a phase adjustment circuit of claim 1; and
    a second phase adjustment circuit, which is a phase adjustment circuit of claim 4,
    wherein a first output terminal of an mth two-phase adjustment circuit (where m indicates an integer from 1 to n) in the first phase adjustment circuit is connected with a second input terminal of an mth two-phase adjustment circuit in the second phase adjustment circuit;
    a second output terminal of the mth two-phase adjustment circuit in the first phase adjustment circuit is connected with a first input terminal of an m+1th two-phase adjustment circuit in the second phase adjustment circuit;
    a signal at a first logic level is input into a first input terminal of a first two-phase adjustment circuit in the second phase adjustment circuit; and
    a signal at a second logic level is input into a second input terminal of an n+1th two-phase adjustment circuit in the second phase adjustment circuit.

6. A phase adjustment circuit for adjusting phases of a plurality of input signals, the circuit comprising,
    first and second phase adjustment circuits, each of which is a phase adjustment circuit of claim 4,
    wherein a signal at a first logic level is input into a second input terminal of an n+1th two-phase adjustment circuit in the first phase adjustment circuit;
    a signal at a second logic level is input into a first input terminal of a first two-phase adjustment circuit in the second phase adjustment circuit;
    a first output terminal of a kth two-phase adjustment circuit (where k indicates an integer from 1 to n+1) in the first phase adjustment circuit is connected with a second input terminal of a kth two-phase adjustment circuit in the second phase adjustment circuit; and
    a second output terminal of an mth two-phase adjustment circuit (where m indicates an integer from 1 to n) in the first phase adjustment circuit is connected with a first input terminal of an m+1th two-phase adjustment circuit in the second phase adjustment circuit.

7. A phase adjustment circuit for adjusting phases of a plurality of input signals, the circuit comprising, first to nth logic circuits, where n is a natural number, wherein the mth logic circuit (where m is each integer from 1 to n−1) receives m−1th and mth signals and outputs, as a new mth signal, a signal whose logic changes in a predetermined manner when the m−1th and mth signals both go to a certain logic level; and the nth logic circuit receives an nth signal and a signal at the certain logic level and outputs, as a new nth signal, a signal whose logic changes in the predetermined manner when the received nth signal goes to the certain logic level.

8. The circuit of claim 7, wherein each of the first to nth logic circuits is an AND gate; and the certain logic level is "H".

9. The circuit of claim 7, wherein each of the first to nth logic circuits is an OR gate; and the certain logic level is "L".

10. A phase adjustment circuit, wherein phase adjustment circuits in multiple stages are connected, each of the phase adjustment circuits being the phase adjustment circuit of claim 7.

11. A phase adjustment circuit for adjusting phases of two input signals, the circuit comprising:

a first logic circuit for performing logical sum of the two signals;

a second logic circuit for performing logical product of the two signals;

a first delay circuit having a signal delay equal to that of the second logic circuit and configured to delay a signal output from the first logic circuit; and a second delay circuit having a signal delay equal to that of the first logic circuit and configured to delay a signal output from the second logic circuit.

12. The circuit of claim 11, wherein the first logic circuit is a NOR gate;

the second logic circuit is a NAND gate;

the first delay circuit is a NAND gate with two input terminals thereof short-circuited; and the second delay circuit is a NOR gate with two input terminals thereof short-circuited.

13. The circuit of claim 11, wherein the first logic circuit is an OR gate;

the second logic circuit is an AND gate;

the first delay circuit is an AND gate; and the second delay circuit is an OR gate.

\* \* \* \* \*